(12) United States Patent
Brice et al.

(10) Patent No.: US 9,991,437 B2
(45) Date of Patent: Jun. 5, 2018

(54) METHOD FOR FORMING A SUPERCONDUCTING CONNECTION STRUCTURE AND SUPERCONDUCTING CONNECTION STRUCTURE

(71) Applicant: SIEMENS PLC, Surrey (GB)

(72) Inventors: Hannah Brice, Kidlington (GB); Wolfgang Haessler, Dresden (DE); Marijn Pieter Oomen, Erlangen (DE); Juliane Scheiter, Bannewitz (DE); Mariusz Wozniak, Witney (GB); Steffen Ziller, Pohrsdorf (DE)

(73) Assignee: SIEMENS PLC, Camberley (GB)

( * ) Notice: Subject to any disclaimer, the term of this patent is extended or adjusted under 35 U.S.C. 154(b) by 0 days. days.

(21) Appl. No.: 15/039,930

(22) PCT Filed: Nov. 26, 2014

(86) PCT No.: PCT/EP2014/075628
§ 371 (c)(1),
(2) Date: May 27, 2016

(87) PCT Pub. No.: WO2015/078897
PCT Pub. Date: Jun. 4, 2015

(65) Prior Publication Data
US 2017/0005256 A1    Jan. 5, 2017

(30) Foreign Application Priority Data
Nov. 27, 2013  (EP) ...................................... 13194554

(51) Int. Cl.
*H01L 39/24*  (2006.01)
*H01L 39/14*  (2006.01)
(Continued)

(52) U.S. Cl.
CPC ........... *H01L 39/141* (2013.01); *H01B 12/02* (2013.01); *H01F 6/065* (2013.01); *H01L 39/02* (2013.01);
(Continued)

(58) Field of Classification Search
CPC .... H01L 39/141; H01L 39/2487; H01B 12/02
See application file for complete search history.

(56) References Cited

U.S. PATENT DOCUMENTS

| 8,809,685 B2 | 8/2014 | Bianchetti et al. | ........ 174/125.1 |
| 8,897,846 B2 | 11/2014 | Drechsler et al. | ............ 505/220 |

(Continued)

FOREIGN PATENT DOCUMENTS

| DE | 102009010011 B3 | 8/2010 | ............ C04B 37/00 |
| DE | 102009043580 A1 | 4/2011 | ............. H01L 39/12 |

(Continued)

OTHER PUBLICATIONS

European Search Report, Application No. 13194554.5, 8 pages, dated Apr. 11, 2014.

*Primary Examiner* — Paul A Wartalowicz
(74) *Attorney, Agent, or Firm* — Slayden Grubert Beard PLLC

(57) ABSTRACT

A method for forming superconducting connection structure between at least two superconducting wires is disclosed, where each wire includes at least one superconducting filament. An end piece of each superconducting wire may be positioned inside a cavity of a pressing tool. A contacting material including MgB2 and/or a precursor material for MgB2 may also be positioned inside the cavity. Pressure may be applied to the contacting material through the pressing tool, and the contacting material may be heated inside the cavity. Pressure and heat may be applied simultaneously, at least during part of the process. A supercon- (Continued)

ducting connection structure including at least two superconducting wires, each wire including at least one superconducting filament, and a superconducting connection between the end pieces of the two wires is also disclosed. The connection may be formed of heated and compressed contacting material including MgB2.

9 Claims, 4 Drawing Sheets

(51) Int. Cl.
  *H01F 6/06*  (2006.01)
  *H01L 39/02* (2006.01)
  *H01R 4/68*  (2006.01)
  *H01B 12/02* (2006.01)

(52) U.S. Cl.
  CPC ...... *H01L 39/2403* (2013.01); *H01L 39/2487* (2013.01); *H01R 4/68* (2013.01)

(56) References Cited

U.S. PATENT DOCUMENTS

| | | | |
|---|---|---|---|
| 2003/0173103 A1 | 9/2003 | Morita et al. | 174/125.1 |
| 2008/0236869 A1 | 10/2008 | Mane et al. | 174/125.1 |
| 2009/0105079 A1 | 4/2009 | Leghissa | 505/220 |
| 2009/0264297 A1 | 10/2009 | Nardelli | 505/230 |
| 2010/0190649 A1 | 7/2010 | Doll et al. | 505/220 |
| 2010/0216645 A1 | 8/2010 | Tenbrink et al. | 505/230 |
| 2012/0108435 A1 | 5/2012 | Ichiki et al. | 505/230 |
| 2014/0364318 A1* | 12/2014 | Lakrimi | B62D 15/027 505/431 |

FOREIGN PATENT DOCUMENTS

| | | | | |
|---|---|---|---|---|
| EP | 1609757 A1 | 12/2005 | | C01B 35/04 |
| EP | 2383968 A1 | 11/2011 | | H04M 3/42 |
| EP | 2383969 A1 | 11/2011 | | H04M 19/02 |
| EP | 2436087 A1 | 4/2012 | | H01R 4/68 |
| WO | 2009/127956 A1 | 10/2009 | | H01R 4/68 |
| WO | WO 2013/107537 | * | 7/2013 | H01L 39/24 |
| WO | 2015/078897 A1 | 6/2015 | | B29C 43/00 |

* cited by examiner

METHOD FOR FORMING A SUPERCONDUCTING CONNECTION STRUCTURE AND SUPERCONDUCTING CONNECTION STRUCTURE

CROSS-REFERENCE TO RELATED APPLICATIONS

This application is a U.S. National Stage Application of International Application No. PCT/EP2014/075628 filed Nov. 26, 2014, which designates the United States of America, and claims priority to EP Application No. 13194554.5 filed. Nov. 27, 2013, the contents of which are hereby incorporated by reference in their entirety.

TECHNICAL FIELD

The invention relates to a method for forming a superconducting connection structure between at least two superconducting wires, each wire comprising at least one superconducting filament. The invention further relates to a superconducting connection structure comprising two such wires and a connection between the end pieces of the wires.

BACKGROUND

Superconducting coils for the generation of strong magnetic fields are often operated in a manner known as persistent current mode. In this mode, the magnet winding is shorted to a closed superconducting circuit, and the current flows almost indefinitely without a substantial resistance in the circuit. This approach results in a magnetic field which is highly stable over time. Stable, homogeneous and strong magnetic fields are for example needed for magnetic resonance imaging and for nuclear magnetic resonance spectroscopy, where magnetic flux densities between 0.5 T and 20 T are common. The magnetic coils for these applications are usually charged via an external circuit and then disconnected from their external power supply. Afterwards, the current flows through the coil in an almost loss-free mode, and the resulting magnetic field does not suffer from the noise contributions of an external power source. In known magnetic resonance coils, one or more superconducting wires are wound onto one or more coil carriers. Several such individual coil sections are usually connected by a superconducting joint. A joint resistance of less than $10^{12}$ Ohm per joint is usually required for persistent mode operation. For some applications, a joint resistance as low as $10^{15}$ Ohm is even necessary. Classical low-temperature superconductors such as Nb—Ti and $Nb_3Sn$ with transition temperatures below 23 K can be joined by superconducting contacts with existing technologies such as soldering with low-temperature superconducting material. The same technique can be used to provide superconducting switches. These switches are part of the closed circuit of the magnetic coil, but for charging the coil they are heated to a normal-conducting state. After charging from an external current source, the switch is again cooled to a superconducting state and the current source is disconnected. High-temperature superconductors are superconducting materials with a transition temperature above 25 K. They are attractive for use in superconducting magnetic coils mainly for two reasons: Low-temperature superconductors require cooling by liquid helium, which is expensive and of limited supply. High-temperature superconductors such as $MgB_2$ and oxide ceramic superconductors can be cooled with cheaper, high-erboiling cryogens. Alternative cooling concepts based on liquid helium are also available, where the amount of helium consumption is reduced, when the coil is operated at a temperature around or above 10K. A second advantage of materials with higher transition temperature is that they usually have a higher intrinsic critical current density and higher critical magnetic fields. Therefore, it is easier to achieve very high magnetic flux densities with high-temperature superconductors. A difficulty of using high-temperature superconductor materials for persistent-mode magnetic coils is that superconducting joints are not readily available.

Connections of $MgB_2$ wires have previously been described by joining the wire ends by additional $MgB_2$ material provided in the joint region.

US 2009/0105079A1 describes a superconductive connection for the stripped end pieces of two superconducting wires. $MgB_2$ is used as a superconducting contact material, which is filled into a sheath or bushing that the two wire ends are also inserted to. The cross-section of the sheath or bushing is then reduced in order to densify the contact material. EP 2436087 also describes a superconductive connection for two wires with $MgB_2$ filaments embedded in a normally conducting matrix material. The stripped filaments and $MgB_2$ or its base materials are inserted into a sleeve or bushing to form a superconducting contact. The filaments are also sheathed with a barrier layer, which is at least partially stripped in the contact region. EP 2383969 also describes a method for producing a connection structure between two superconductors, in particular $MgB_2$ conductors. Here, a substance which lowers the melting temperature of magnesium is admixed to a material mixture of magnesium and boron and the exposed ends of the core wires are brought in contact with the material mixture, which is made to react with $MgB_2$ in situ.

WO2009127956A1 describes a superconducting joint that structurally binds a first superconducting segment to a second superconducting segment. The superconducting segments each include corresponding areas containing a granular superconducting substance formed by a first element and a second element. The superconducting joint includes a solid non-superconducting binding formed from a source of the first element and a source of the second element combined to produce the granular superconducting substance around the solid non-superconducting binding to form the superconducting joint.

However, these methods described so far have not provided a way of obtaining superconducting joints which have a joint resistance below $10^{12}$ Ohms measured with significant current of 10 A or higher, at temperatures of 10 K or higher and at background magnetic fields of IT or more.

SUMMARY

Embodiments of the invention provide a superconducting connection structure and a method for forming a superconducting connection structure that overcomes one or more drawbacks of conventional structures and methods.

One embodiment provides a method for forming a superconducting connection structure between at least two superconducting wires, each wire comprising at least one superconducting filament, said method comprising the steps of: positioning an end piece of each of the superconducting wires inside a cavity of a pressing tool, positioning a contacting material comprising $MgB_2$ and/or a precursor material for $MgB_2$ inside the cavity, applying pressure to the contacting material through the pressing tool, and heating the contacting material inside the cavity, wherein pressure and heat are applied simultaneously at least during part of the process.

In a further embodiment, the method further comprises removing the superconducting connection structure, which comprises compressed contacting material connecting the superconducting wires, from the pressing tool.

In a further embodiment, the pressing tool is a uniaxial pressing tool, comprising two punches and a die confining the cavity of the pressing tool.

In a further embodiment, contacting material comprises a powder.

In a further embodiment, the contacting material comprises a mechanically alloyed powder mixture comprising at least magnesium and boron.

In a further embodiment, the applied pressure is between 50 MPa and 500 MPa.

In a further embodiment, more than one level of pressure and/or more than one level of temperature applied in a plurality of process steps.

In a further embodiment, the contacting material inside the cavity is heated to a temperature between 500° C. and 700° C.

In a further embodiment, the end pieces of the superconducting wires are inserted into a wire holder and positioned inside the cavity together with the wire holder.

Another embodiment provides a superconducting connection structure comprising: least two superconducting wires, each wire comprising at least one superconducting filament, and a superconducting connection between the end pieces of the at least two superconducting wires formed of heated and compressed contacting material comprising $MgB_2$.

In a further embodiment, the superconducting connection structure has the form of a self-supporting tablet.

In a further embodiment, the superconducting connection further comprises a wire holder supporting the end pieces of the superconducting wires inside the connection structure.

In a further embodiment, the superconducting connection is formed by a heated and compressed powder.

In a further embodiment, the powder comprises at least $MgB_2$ or a precursor material for $MgB_2$.

In a further embodiment, the superconducting filaments comprise $MgB_2$.

BRIEF DESCRIPTION OF THE DRAWINGS

Example aspects and embodiments of the invention are described in detail below with reference to the drawings, in which.

DETAILED DESCRIPTION

Figure 1:
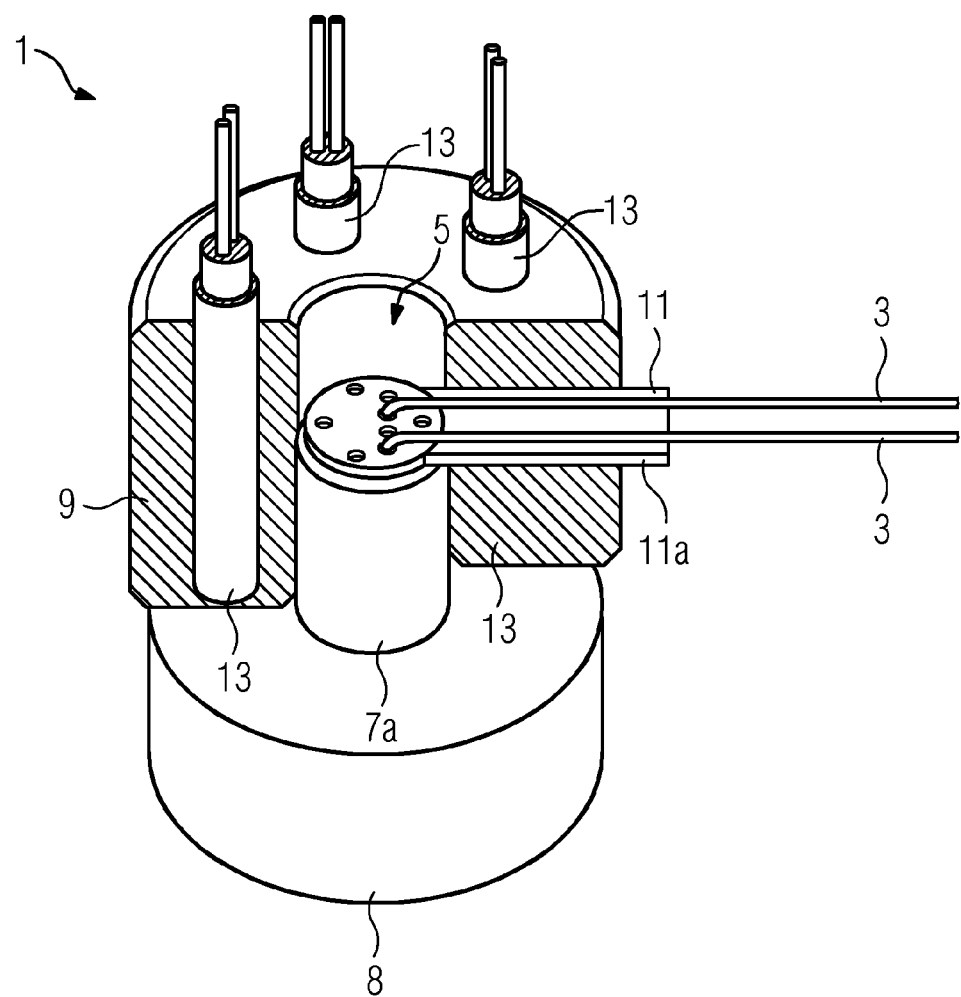
FIG. 1 shows a schematic perspective view of part of the pressing tool.

Some embodiments of the invention provide a method for forming a superconducting connection structure between at least two superconducting wires is provided, where each wire comprises at least one superconducting filament. An end piece of each of the at least two superconducting wires is positioned inside a cavity of a pressing tool. A contacting material comprising $MgB_2$ and/or a precursor material for $MgB_2$ is further positioned inside the cavity. Pressure is applied to the contacting material through the pressing tool and the contacting material is heated inside the cavity. Pressure and heat are applied simultaneously at least during part of the process.

It is thus proposed to form a superconducting joint with the $MgB_2$ or $MgB_2$ precursor material between at least two superconducting wires by hot pressing $MgB_2$ or its precursor together with the wire ends of the at least two wires to be joined. The term "connection structure" is meant to comprise the joint itself as well as the ends of the filaments to be joined and the surroundings of the joint. The term "filament" is meant to cover any type of electrical conductor lead of elongate shape, without restriction to a certain thickness of the conductor lead. A precursor material for $MgB_2$ should comprise Mg and B and/or chemical compounds comprising these two elements. The precursor material can comprise other elements and/or compounds as additives. Advantageously, enough precursor material to cover the wire ends is used. Alternatively or in addition to the use of a precursor material, the contacting material can comprise $MgB_2$ which is already formed ex situ. For example, pre-reacted $MgB_2$ can be used as a contacting material in granular form, and the grains can be sintered or otherwise connected during the formation of the connection structure. The hot pressing step is performed inside a dedicated pressing tool, advantageously a uniaxial pressing tool, which is itself not part of the connection structure. This is in contrast to the sleeve or bushing, the cross-section of which is reduced in the product of known connection structures. The use of a dedicated pressing tool allows the application of a much better controlled and more uniform pressure over the volume of contacting material, than the reduction of the cross-section by compressing the outer sleeve or bushing of the known connection structures.

The simultaneous application of pressure and heat aids the formation of a low-resistivity superconducting joint between the wire ends and the contacting material. The applied heat is applied with the temperature high enough and for long enough to cause at least partial reaction and/or sintering of precursor and/or $MgB_2$ powder. The amount of pressure applied is limited in order to avoid mechanical cracking of the filaments in superconducting wires.

The superconducting connection between the wire ends can advantageously be formed by reacting a precursor material to $MgB_2$ during the hot pressing step. The simultaneous application of heat and pressure allows this reaction to take place in a controlled fashion at relatively low temperatures. A high portion of the precursor material can be reacted and a high quality connection can be formed at a lower reaction temperature compared to a reaction without the simultaneous pressure application. A low reaction temperature could be crucial in preserving the quality and low resistivity of the superconducting wires to be joined. The application of pressure throughout the reaction phase further helps to compensate for the precursor material volume loss due to the reaction itself. The resulting partially or fully reacted $MgB_2$ in principle has a higher density than a mixture of the base materials magnesium and boron. If pressure is applied to the whole volume of contacting material during the reaction phase, this volume loss can be compensated by continuous densification of the contacting material, and a higher density of this material in the resulting connection structure can be achieved. Accordingly, the connection structure may comprise at least two superconducting wires, each wire comprising at least one superconducting filament and a superconducting connection between the end pieces of the at least two wires. The connection is formed by heated and compressed contacting material comprising $MgB_2$. The advantages of the superconducting connection structure are analogous to the advantages of the method, as described above.

In some embodiments, the superconducting connection structure, which comprises compressed contacting material connecting at least two superconducting wires, can be removed from the pressing tool. In particular, can be removed after the pressing step. In this implementation, the pressing tool is not an integral part of the connection structures. Instead it is a tool which can be reused multiple times and is not necessary to maintain the structure of the pressed connection material. The connection material is sufficiently densified due to the combined application of heat and pressure to be a self-supporting structure. In this context, self-supporting shall mean that the compressed connection material is solid enough so that it can be removed from the pressing tool in one piece. It can still be further supported by an additional encasing and/or coating and protected from mechanical and environmental stress. The whole connection structure can also be further supported by a wire holder as described below. An important distinction from previous connection structures is that the compressed connection material is solid enough to allow further handling without a complete encasing on all sides. The compressed connection material can even be sufficiently solid that it can be removed from the pressing tool while it is still hot. This can facilitate the removal of the pressed tablet from the pressing tool. In this context, a "tablet" is a compressed part of the connection structure. Such a structure can alternatively be referred to as a "pellet".

After removal from the pressing tool, the connection structure can be encapsulated in a structure impermeable to air and/or moisture in order to protect the connection structure from environmental degradation.

As an alternative to removing the connection structure from the pressing tool, the pressing tool can remain a part of the connection structure after it has been formed.

The pressing tool can be a uniaxial pressing tool. The pressing tool can comprise two punches and a die confining the cavity of the pressing tool. Advantageously, the two punches are positioned at opposing ends of the cavity, and the die surrounds or at least partially surrounds the cavity on the remaining sides. Pressure can then favorably be applied to material inside the cavity by pressing onto one of the punches or onto both punches simultaneously. In other words, the pressing tool can be a tablet pressing tool. The die of the pressing tool can be shaped such that the cavity is bounded by an essentially cylindrical side wall. This can be a cylindrical side wall with an arbitrary base plane, according to the more general definition of a cylinder, which does not need to be a circular cylinder. The punches can have a flat shape, which would then result in an overall essentially cylindrical shape of the compressed parts. Alternatively, one or both punches can also have an essentially concave or convex shape, which in turn leads to concave and/or convex shapes of the corresponding surfaces of the compressed part of the connection structure. The cylindrical shape can be distorted or interrupted at least on one side, to accommodate the protruding parts of the connected wires and possibly an additional wire holder as described below.

The contacting material can comprise a powder. In particular, it can comprise a powder mixture of magnesium and boron. Alternatively or additionally, it can comprise $MgB_2$ powder, particularly a pre-reacted $MgB_2$ powder. Advantageously, the contacting material can comprise a fine powder with an average grain size between 50 nm and 200 ym, particularly advantageously between 100 nm and 1 ym.

The contacting material can comprise a powder obtained by mechanical alloying of a mixture of magnesium and boron powder. The boron powder component is favorably an amorphous powder of at least 99% purity. Mechanical alloying can for example be performed by high-energy ball milling under inert atmosphere, for example under argon over 10 to 50 hours, at total milling energies of $10^8$ to $10^9$ J/kg. Mechanical alloying results in smaller and therefore more reactive grains, as well as a partial reaction of Mg and B to $MgB_2$ already during the mechanical alloying. Such a mechanically alloyed powder can react to MgB2 at temperatures of 650° C. or less.

The applied pressure can be between 50 MPa and 500 MPa. A pressure in this range is suitable for compressing the contacting material, for aiding the formation of a contact between the superconducting wires and the contacting material and/or for producing a superconducting form of the contacting material. A varying pressure can be applied during different phases of the process. For example, a first pressure can be applied before the heating and a second pressure can be applied during the heating step. The pressure can be ramped up from a lower first pressure to a higher second pressure either before or during the heating step. Alternatively, the heat can be applied either before applying the pressure or the temperature can be ramped up after applying pressure to the contacting material. The applied pressure can be substantially uniform during the part of the process when pressure and heat are applied simultaneously. In other words, there can be at least one process phase where heat is applied and where a near-uniform pressure is applied to the pressing tool, particularly to at least one of the punches of the pressing tool, in order to compensate for a volume loss of the powder during heat treatment. The pressing tool can be configured such that substantially all regions of the contacting material inside the cavity are subjected to a similar pressure.

More than one level of pressure and/or more than one level of temperature can be applied in a plurality of process steps. In other words, a series of different pressures and/or different temperatures can be applied either as a continuous ramp process or as a succession of several distinct process steps. Also, temperature and pressure do not need to be applied simultaneously during the whole process. They only need to be applied simultaneously during at least one of such process steps.

The contacting material inside the cavity can be heated to a temperature not exceeding 700° C., for example a temperature between 500° C. and 700° C. Particularly advantageously, the temperature can be at or below 650° C. The simultaneous application of heat and pressure allows the formation of superconducting connections based on $MgB_2$ at temperatures at or below 700° C. In particular, lower reaction temperatures can be achieved by using a very fine power of magnesium and boron or by using a mixture of $MgB_2$ and the starting materials magnesium and boron. A lower process temperature can also be achieved by adding a substance to the precursor material which causes appearance of magnesium rich liquid phase at temperatures lower than the melting point of magnesium. This greatly enhances the reaction rate between Mg and B at lower temperatures. Favorable examples for such an additive are silver and/or copper powders, in particular at weight ratios between 1% and 20%. Further suitable additives may include one or more of Al, C, Co, Cr, Fe, Mn, Mo, Nb, Ni, Pd, Ru, Sc, Si, Ti, V, Y, Zr, Ce, Pt, Ca, Ga, H, La, Pb, Sn, St, Tl, and Zn. The end pieces of the at least two superconducting wires can be inserted into a wire holder and positioned inside the cavity together with the wire holder. Such a wire holder can be advantageous to provide further mechanical support to the resulting connection structure. It can also protect the superconducting wires from mechanical stress during the pressing process, for example to avoid cracking of the superconducting filaments in the wires. To this end, the wire holder can be equipped with an appropriate number of grooves to accommodate the number of wires to be jointed. The shape of such grooves can be matched to the shape of flat tape-like wires or other wires with rectangular cross sections. The grooves can also be shaped to match other wire cross sections such as circular cross sections. However, a rectangular wire cross section is most favorable in order to minimize mechanical stress due to the pressing process on all sides of the wires. The grooves in the wire holder can extend in parallel or essentially parallel directions, such that the two wires can be routed close to each other. In this configuration the protruding wires and the protruding wire holder only lead to a small distortion of the advantageous cylindrical shape of the resulting tablet of compressed contacting material. Alternatively, the grooves and the superconducting wires can be positioned at an angle with respect to each other. The grooves in the wire holder can be of the same cross sectional shape as the superconducting wires but with slightly larger cross section than the superconducting wires. Then the grooves in the wire holder provide mechanical support for superconducting wires ends to stop them from widening and lengthening where pressure is applied.

The wire holder can be shaped such that it covers at least a large fraction of the area of one of the two punches. For example the wire holder with the wires can be positioned on the lower punch, and the die can be positioned around the lower punch and the wire holder with the wires. The contacting material can be filled in to the resulting cavity, and then the upper punch can be inserted, and mechanical pressure can be applied to at least one of the two punches.

Such a wire holder also allows easy and precise mounting of the wire ends inside the pressing tool. For example the wire holder can be equipped with a holding element such as a screw and/or clamp to each wire inside the groove. This way, the superconducting wires are immobilized to stop them from moving when pressure is applied.

The wire holder can advantageously become an integral part of the connection structures after pressing the contacting material and forming a superconducting connection. For example, the wire holder can serve as a base plate providing further mechanical stability to the compressed tablet with its protruding wires. In this case the strength of the mechanical bond between the wire holder and the tablet can be increased by enlarging the surface area of the wire holder, for example by surface indents such as holes or grooves or a roughening surface treatment of the wire holder.

In one embodiment, the wire holder can be equipped with alignment and/or mounting structures to facilitate the mounting of the connection structure in a coil system. For example, the bottom of the base plate can be equipped with one or more holes to aid with mechanical attachment.

The wire holder can comprise a thermally conductive material in order to facilitate cooling of the superconducting connection structure inside a magnetic coil system. For example, the wire holder can comprise a material with a specific thermal conductivity of at least 1 W/(m-K) 20K or particularly advantageously at least 10 W/(m-K) at 20K. The wire holder cart also be used to screen superconducting currents.

At least part of the process of forming the connection structure can be performed under vacuum or under inert atmosphere. In particular, this can be at least the process step during which heat and pressure are applied simultaneously. This allows the formation of a high-quality superconducting connection with a low contact resistance. It prevents a degradation of the contacting material, for example due to oxidation.

However, the process can also be carried out in air, because after filling the contacting material into the cavity, the volume of enclosed air is relatively small and only a small amount of oxidation occurs inside this confined space.

The superconducting wires can further comprise a normally conducting matrix material, in which one or more superconducting filaments are embedded. This matrix material can be stripped at least in the end regions of the wires before the wires are inserted into the cavity of the pressing tool. The superconducting material of the filaments can also be exposed by beveling the wire ends. The wires can for example be exposed by a mechanical or chemical process, without being limited to such processes.

The superconducting wires can further comprise a barrier material surrounding the at least one superconducting filament. The barrier material can also be stripped in the end regions and/or the superconducting material can be exposed by beveling the wire ends.

In some embodiments, the connection structure can have the form of a self-supporting tablet. In other words, the tablet can be a solid and/or porous body, which can be handled after removing it from the pressing tool.

The compressed connection material can advantageously have a volume fill factor of at least 60% and/or a mass density of at least 1.4 g/cm$^3$. Particularly advantageously, the volume fill factor can be at least 90% and/or the mass density can be at least 2.4 g/cm$^3$. Such a high density of the connection material can only be reached by the simultaneous application of pressure and heat. The high density is a prerequisite for achieving a contact resistance of $10^{-12}$ Ohms or less at high magnetic fields.

The connection structure can comprise a wire holder supporting the end pieces of the superconducting wires inside the connection structure. This wire holder can provide further mechanical support and stability to the tablet described above, for example in the form of a base plate to which the compressed connection material is attached by the mechanical pressure.

The connection structure can have a connection resistance of $10^{-12}$ Ohms or less at a magnetic flux density of IT and a temperature of 10K.

The contacting material can comprise unreacted precursor material and/or other additives in addition to $MgB_2$.

The connection structure can be formed of a heated and compressed power. Such a powder can also comprise a mixture of powder materials.

The powder can comprise at least $MgB_2$ or a precursor material for $MgB_2$, such as a mixture of magnesium and boron powder. In particular, the powder can also comprise a mixture of $MgB_2$ and precursor material for $MgB_2$, as well as possible additives to the powder to promote the reaction to form $MgB_2$. The superconducting filaments can comprise $MgB_2$. Such $MgB_2$ filaments may be prepared by an in situ, ex situ, internal magnesium diffusion route and/or mixture and/or combination of these routes. The use of $MgB_2$ filaments is, particularly favorable, because a $MgB_2$ based connection material is particularly suited to provide a superconducting connection between two $MgB_2$ based wires.

Alternatively, the superconducting wires can also be based on a ceramic oxide high-temperature superconductor, and $MgB_2$ based connection material can be used to connect two such wires or tapes. As a further alternative, the superconducting wires can be based on a low-temperature superconductor such as NbTi or $Nb_3Sn$. The advantage of an $MgB_2$ based connection material for a low-temperature superconductor would be that the connection can be superconducting at high background magnetic fields, for example at magnetic flux densities of 1 T or more. The superconducting connection structure can advantageously be used in a magnetic coil structure for magnetic resonance imaging or nuclear magnetic resonance spectroscopy. However, it is not limited to these applications. Alternatively, it can be advantageously implemented to any superconducting system where a persistent current mode operation is required to achieve a temporarily stable magnetic field, for example also for superconducting magnetic energy storage.

FIG. 1 shows a schematic perspective view of part of the pressing tool 1 used to form a superconducting connection structure according to one embodiment of the invention. The pressing tool 1 comprises a base 8 on which a lower punch 7a is mounted. In this example, a wire holder 11 is positioned on top of the lower punch 7a and the end pieces 3a of two superconducting wires 3 are mounted into grooves 19 of the wire holder 11. A die 9 of the pressing tool 1 is then positioned on top of and around this assembly. In this example, the die 9 has a near cylindrical shape with a circular base and a cylindrical hole in the center. On one side, there is an opening in the bottom part of the cylinder to accommodate the superconducting wires 3 and the end part of the wire holder 11 protruding from the center of the arrangement. In FIG. 1 only the rear part of the cylindrical die 9 is shown in order to show the ends of the superconducting wires 3 assembled in the wire holder 11 in the center of the pressing tool 1. In this example, the complete die structure 9 forms a full ring above the level of the wire holder 11 and partial ring at and below the level of the wire holder 11.

The pressing tool 1 of the preferred embodiment also comprises a number of heating elements 13, in this case five resistive heating cartridges which are integrated into the die 9. These heating elements 13 are used to heat material filled into the cavity 5 of the pressing tool 1. They can be connected to a temperature controller to precisely control the temperature and the heating and cooling ramps that may used in the manufacturing process. As an alternative to the resistive heating elements 13, an inductive heating process can also be used to heat the contacting material 15 inside the cavity 5.

Figure 2:
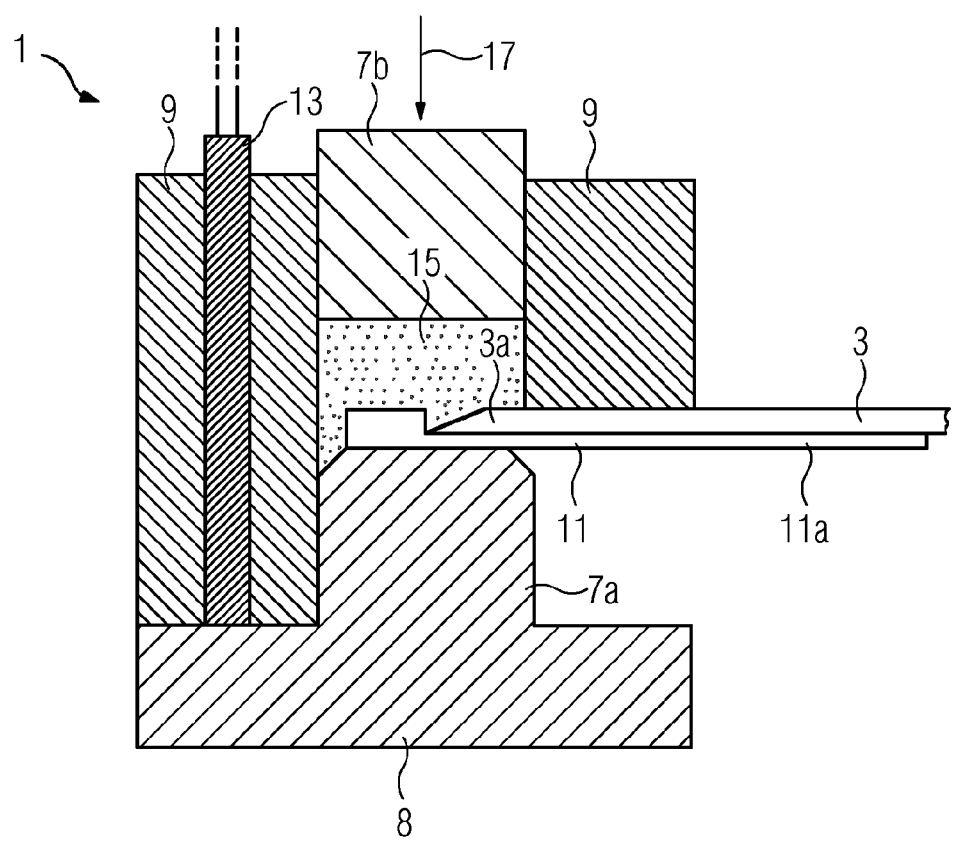
FIG. 2 shows a lateral cross section near the center of the pressing tool.

FIG. 2 shows a schematic lateral cross section of the pressing tool 1 near the center and along one of the two superconducting wires 3. This cross section shows the base 8 with the lower punch 7a and the die 9 with cylindrical base shape and an opening below the side part 11a of the wire holder. One of the five heating elements 13 integrated into the die 9 is also shown. FIG. 2 shows the pressing tool 1 in its fully assembled state, where a contacting material 15 has been filled into the cavity 5 and an upper punch 7b has been positioned on top of the contacting material 15. The cavity 5 of the pressing tool 1 is thus confined by the lower punch 7a and partially by the wire holder 11 at the bottom, by the die 9 on the sides and by the upper punch 7b at the top. In FIG. 2, a void is shown below the side part 11a of the wire holder 11, where the cylindrical die 9 is interrupted. Alternatively, this void can be filled with an additional support structure to further support the wire holder 11 over a larger part of its length.

In the preferred embodiment, the contacting material 15 is a mixture of magnesium powder and boron powder. The mixture has been pre-treated by high-energy ball milling under inert atmosphere over about two days. Alternatively, ball milling can for example be performed for other durations between 5 and 100 hours. The resulting contacting material 15 is thus a mechanically alloyed powder, which can react to $MgB_2$ at a temperature between about 575° C. and 700° C. The average grain size of the powder is below 1 µm. After this powder is filled into cavity 5 and the upper punch 7b has been mounted, a pressure 17 applied to the upper punch 7b and thus between the two punches 7a and 7b confining tree cavity at the top and at the bottom. At least during part of the time period, when pressure 17 is applied, the contacting material 15 inside the cavity 5 is heated by thermal conduction from the heating elements 5. In general, the applied pressure 17 should preferably be at least 50 MPa, and the temperature inside the cavity 5 should be between 575° C. and 700° C. in order to lead to a reaction of the starting material to $MgB_2$ and/or to the formation of a superconducting connection between the end pieces 3a of superconducting wires 3 and contacting material 15.

Many different process ramps for the heating process and the applied pressure 17 are possible. Three preferred examples are given below:

Example a

In a first step, a pressure between 100 MPa and 500 MPa is applied. In a second step, the contacting material 15 is heated to a temperature between 550° C. and 700° C. In a third step, the pressure and the temperature are both held constant for a period of 5 min to 30 min, and in a fourth step the compressed contacting material 15 is allowed to cool down while under pressure. In this example, the whole reaction from the starting materials to $MgB_2$ is performed under near constant pressure, leading to a high density of the compressed tablet 27 that is formed.

Example b

In a first step, a pressure between 50 MPa and 100 MPa is applied. In a second step, the contacting material 15 is heated to a temperature between 550° C. and 650° C. In a third step, the pressure is increased to a level from 150 MPa to 500 MPa. In a fourth step, the pressure and the temperature are both held constant for a period of 5 min to 30 min, and in a fifth step the compressed contacting material 15 is allowed to cool down while under pressure.

Example c

In a first step, the contacting material 15 is heated to a temperature between 550° C. and 650° C. In a second step, a pressure between 150 MPa and 500 MPa is applied, and in a third step, the pressure and the temperature are both held constant for a period of 5 min to 30 min. In a fourth step, the compressed contacting material is allowed to cool down. In this example, the reaction is started at ambient pressure, and the pressure is increased during the course of the reaction, thus densifying the material more gradually.

In all examples, it is advantageous not to allow the connection structure 25 to cool down completely to room temperature while inside the pressing tool 1, but to push it out of the pressing tool 1 while still at an elevated temperature. This elevated temperature is usually below the reaction temperature, for example at around 500° C. When cooled down to room temperature, the connection structure 25 may get stuck in the pressing tool 1 due to differences in thermal expansion between the materials.

Alternatively, the connection structure 25 can also cool down to ambient temperature and then be removed from the pressing tool 1. Preferable materials for the lower punch 7a, the upper punch 7b, the die 9 and the wire holder 11 are metals or metal alloys. In this example, all four above-mentioned elements are made of steel alloy type 2.4668. The use of this alloy for the wire older 11 facilitates the formation of a solid connection structure 25 by adhesion of the compressed powder material 15 to the wire holder 11. In order to avoid adhesion of the contacting material 15 to the three parts 7a, 7b and 9 of the pressing tool 1, these parts can be impregnated with a release agent before assembling the pressing tool 1. Boron nitride or a different release agent can be used.

In the example shown in FIG. 2 the superconducting wires 3 are wires comprising $MgB_2$ superconducting filaments. Each wire can comprise one or more such lead filaments. The leads can be embedded in a matrix of non-conducting matrix material and/or the leads can be coated with a protective barrier material. The end pieces 3a of the superconducting wires can advantageously be stripped of such matrix and/or barrier material. For example, the end pieces 3a can be cut to a tapered shape as indicated in the drawing of FIG. 2. The angle of this tapered surface in this drawing is not to scale. The angle can for example be within a favorable range of 3° to 30°. Advantageously, the length of the end pieces 3a which extend into the cavity 5 can be between just the length of the sloped ends and twice the length of the sloped ends of the wires. Wire ends 3a can be also prepared, by other mechanical and/or chemical means. The end pieces 3a can form a multitude of steps instead of having a continuous slope.

Figure 3:
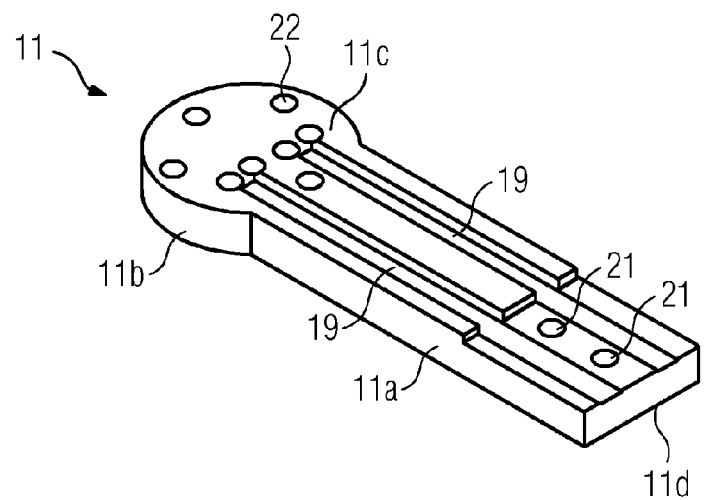
FIG. 3 shows a schematic perspective view of the wire holder.

FIG. 3 shows a more detailed view of the wire holder 11. The wire holder 11 is equipped with two grooves 19 to accommodate the superconducting wires 3. In this example, the two grooves 19 have a rectangular cross section to hold two flat, rectangular wires 3. The wire holder 11 is further equipped with a number of holes 21 and 22 in the top surface 11c. Two clamp holes 21 are positioned on the wire end 11a of the wire holder 11 and can be used to hold a clamp 29 in order to hold the superconducting wires 3 in place. The wire holder 11 is further equipped with a number of tablet holes 22 in the tablet end lib of the wire holder 11. The tablet holes 22 will be filled with contacting material 15 when pressure 17 is applied. Such a connection increases the bonding strength between the wire holder 11 and the tablet 27. A high bonding strength between the wire holder 11 and the tablet 27 can be achieved by other means not limited to but including mechanical scratching and/or sanding in order to increase the surface area of the top surface 11c. A high bonding strength between the holder 11 and the tablet 27 is required to sustain strain caused by different thermal contraction of these elements resulting from cooling down from the heat treatment temperature to a joint operating cryogenic temperature.

Figure 4:
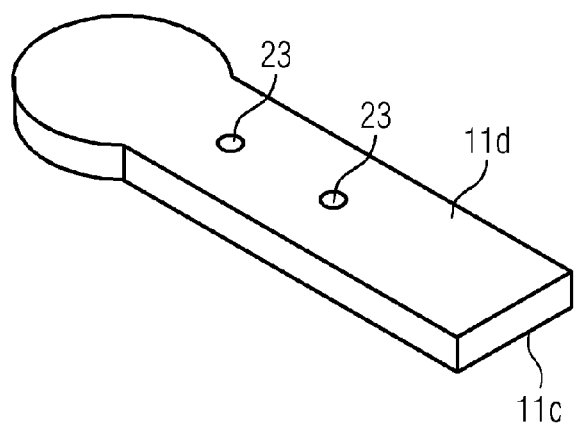
FIG. 4 shows a schematic view of the bottom surface of the wire holder.
Figure 5:
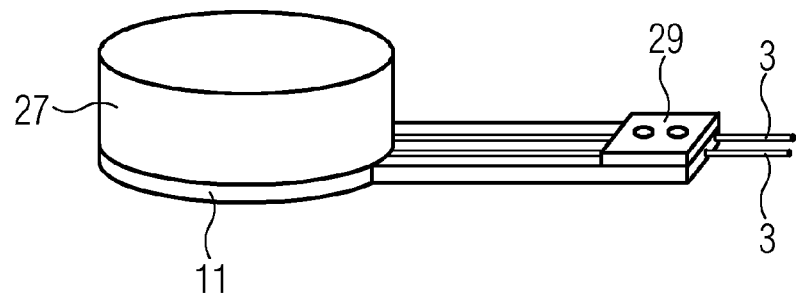
FIG. 5 shows a schematic perspective view a superconducting connection structure.

FIG. 4 shows a view of the bottom surface lid of the wire holder 11. The bottom surface lid is further equipped with a number of bottom holes 23. These bottom holes 23 can be used for example to fix the whole connection structure 25 in an overall coil arrangement. FIG. 5 shows a schematic perspective view of a superconducting connection structure 25 after release from the pressing tool 1. The connection structure 25 of this preferred embodiment comprises a wire holder 11, two superconducting wires 3, a clamp 29 which holds the wires 3 inside the grooves 19 of the wire holder 11, and a tablet 27 of compressed contacting material. In this example, the wire holder 11 has become an integral part of the whole connection structure 25. In alternative embodiments, the wire holder can also be released from the finalized connection structure 25, for example if it is a part of the pressing tool 1. In such an alternative example, the wire holder 11 could also be treated with a release agent, and the tablet 27 with the two wire ends 3a would form the connection structure 25. In any case, the tablet 27 is dense and stable enough so the upper part of the tablet 27 is a self-supporting structure that does not need a special encasing in order to be released from the pressing tool 1 in one piece. The assembly of the wires and the pressing process can also be carried out without a wire holder 11.

What is claimed is:

1. A method for forming a superconducting connection structure between at least two superconducting wires, each wire comprising at least one superconducting filament, the method comprising:
   positioning an end piece of each of the superconducting wires inside a cavity of a pressing tool,
   positioning a contacting material comprising at least one of $MgB_2$ or a precursor material for $MgB_2$ inside the cavity,
   applying pressure to the contacting material through the pressing tool at a first pressure level,
   heating the contacting material inside the cavity, wherein pressure and heat are applied simultaneously at least during at least a part of the process, and
   maintaining the pressure applied at the first pressure level during the simultaneous part of the process and compensating for a volume loss of the contacting material during heat treatment.

2. The method of claim 1, further comprising removing the superconducting connection structure, which comprises compressed contacting material connecting the superconducting wires, from the pressing tool.

3. The method of claim 1, wherein the pressing tool is a uniaxial pressing tool comprising two punches and a die confining the cavity of the pressing tool.

4. The method of claim 1, wherein the contacting material comprises a powder.

5. The method of claim 1, wherein the contacting material comprises a mechanically alloyed powder mixture comprising at least magnesium and boron.

6. The method of claim 1, wherein the applied pressure is between 50 MPa and 500 MPa.

7. The method of claim 1, wherein more than one level of pressure or more than one level of temperature is applied in a plurality of process steps.

8. The method of claim 1, wherein the contacting material inside the cavity is heated to a temperature between 500° C. and 700° C.

9. The method of claim 1, wherein the end pieces of the superconducting wires are inserted into a wire holder and positioned inside the cavity together with the wire holder.

* * * * *